US008795430B2

(12) United States Patent
Farrell et al.

(10) Patent No.: US 8,795,430 B2
(45) Date of Patent: Aug. 5, 2014

(54) METHOD OF IMPROVING SURFACE MORPHOLOGY OF (GA,AL,IN,B)N THIN FILMS AND DEVICES GROWN ON NONPOLAR OR SEMIPOLAR (GA,AL,IN,B)N SUBSTRATES

(75) Inventors: Robert M. Farrell, Goleta, CA (US); Michael Iza, Santa Barbara, CA (US); James S. Speck, Goleta, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 914 days.

(21) Appl. No.: 12/716,176

(22) Filed: Mar. 2, 2010

(65) Prior Publication Data
US 2010/0219416 A1 Sep. 2, 2010

Related U.S. Application Data

(60) Provisional application No. 61/156,710, filed on Mar. 2, 2009, provisional application No. 61/184,535, filed on Jun. 5, 2009.

(51) Int. Cl.
| | | |
|---|---|---|
| B32B 27/32 | (2006.01) |
| B32B 17/10 | (2006.01) |
| B32B 9/00 | (2006.01) |
| B32B 19/00 | (2006.01) |
| C30B 23/00 | (2006.01) |
| C30B 25/00 | (2006.01) |
| C30B 28/12 | (2006.01) |
| C30B 28/14 | (2006.01) |

(52) U.S. Cl.
USPC ............. 117/84; 117/101; 428/220; 428/409; 428/698; 428/699; 428/700

(58) Field of Classification Search
USPC ............ 117/84, 101; 428/220, 409, 698, 699, 428/700
See application file for complete search history.

(56) References Cited

U.S. PATENT DOCUMENTS 7,220,324 B2    5/2007  Baker et al.
8,158,497 B2 *  4/2012  Hirai et al. ................... 438/486

(Continued)

FOREIGN PATENT DOCUMENTS

CN    101138091    3/2008
CN    101270471    9/2008

(Continued)

OTHER PUBLICATIONS

Yamada et al., "Impact of Substrate Miscut on the M-plane InGaN/GaN Light Emitting Diodes", Japanese Journal of Applied Physics, vol. 46, No. 46, 2007, pp. L1117-L1119.*

(Continued)

*Primary Examiner* — Jonathan Langman
(74) *Attorney, Agent, or Firm* — Gates & Cooper LLP

(57) ABSTRACT

A method for improving the growth morphology of (Ga,Al,In,B)N thin films on nonpolar or semipolar (Ga,Al,In,B)N substrates, wherein a (Ga,Al,In,B)N thin film is grown directly on a nonpolar or semipolar (Ga,Al,In,B)N substrate or template and a portion of the carrier gas used during growth is comprised of an inert gas. Nonpolar or semipolar nitride LEDs and diode lasers may be grown on the smooth (Ga,Al,In,B)N thin films grown by the present invention.

21 Claims, 15 Drawing Sheets

(56) References Cited

U.S. PATENT DOCUMENTS

| | | |
|---|---|---|
| 2005/0214992 A1 | 9/2005 | Chakraborty et al. |
| 2006/0029832 A1* | 2/2006 | Xu et al. ............... 428/698 |
| 2007/0111488 A1 | 5/2007 | Chakraborty et al. |
| 2007/0184637 A1 | 8/2007 | Haskell et al. |
| 2007/0190758 A1 | 8/2007 | Kaeding et al. |
| 2007/0218703 A1 | 9/2007 | Kaeding et al. |
| 2007/0267654 A1 | 11/2007 | Chakraborty et al. |
| 2008/0232416 A1 | 9/2008 | Okamoto et al. |
| 2008/0296626 A1 | 12/2008 | Haskell et al. |
| 2010/0096615 A1 | 4/2010 | Okamoto et al. |
| 2010/0213436 A1* | 8/2010 | Khan ............... 257/13 |

FOREIGN PATENT DOCUMENTS

| | | |
|---|---|---|
| JP | 2007243006 | 9/2007 |
| JP | 2008109066 | 5/2008 |
| WO | 2008/014521 | 4/2008 |
| WO | 2008/067537 | 6/2008 |

OTHER PUBLICATIONS

Chichibu et al., "Origin of defect-insensitive emission probability in In-containing (Al,In, Ga)N alloy semiconductors." Nature Materials, vol. 5, pp. 810-816, Oct. 2006.

International Search Report mailed Apr. 12, 2010, International application No. PCT/US10/25959, International filing date Mar. 2, 2010.

Cho, Y. et al., "The growth mechanism of GaN with different H2/N2 carrier gas ratios," Journal of Crystal Growth 307 (2007) pp. 6-13.

Della Sala, F. et al., "Free-carrier screening of polarization fields in wurtzite GaN/InGaN laser structures," Applied Physics Letters, vol. 74, No. 14, Apr. 5, 1999, pp. 2002-2004.

Di Carlo, A. et al., "Doping screening of polarization fields in nitride heterostructures," Applied Physics Letters, vol. 76, No. 26, Jun. 26, 2000, pp. 3950-3952.

Gardner, N. et al., "Polarization anisotropy in the electroluminescence of m-plane InGaN-GaN multiple-quantum-well light-emitting diodes," Applied Physics Letters 86 (2005), pp. 111101-1-111101-3.

Grandjean, N. et al., "Built-in electric-field effects in wurtzite AlGaN/GaN quantum wells," Journal of Applied Physics, vol. 86, No. 7, Oct. 1, 1999, pp. 3714-3720.

Hirai, A. et al., "Formation and reduction of pyramidal hillocks on m-plane {1100} GaN," Applied Physics Letters 91 (2007) pp. 191906-1-191906-3.

Im, J. et al., "Reduction of oscillator strength due to piezoelectric fields in GaN/AlxGa1-xN quantum wells," Physical Review B, vol. 57, No. 16, Apr. 15, 1998, pp. R9435-R9438.

Koyama, T. et al., "Prospective emission efficiency and in-plane light polarization on nonpolar m-plane InxGa1-xN/GaN blue light emitting diodes fabricated on freestanding GaN substrates," Applied Physics Letters 89 (2006) pp. 091906-1-091906-3.

Lefebvre, P. et al, "High internal electric field in a graded-width InGaN/GaN quantum well: Accurate determination by time-resolved photoluminescence spectroscopy,"Applied Physics Letters, vol. 78, No. 9, Feb. 26, 2001, pp. 1252-1254.

Masui, H. et al., "Polarized light emission from nonpolar InGaN light-emitting diodes grown on a bulk m-plane GaN substrate," Japanese Journal of Applied Physics, vol. 44, No. 43, 2005, pp. L1329-L1332.

Nakamura, S. et al., "InGaN/GaN/AlGaN-based laser diodes with modulation-doped strained-layer superlattices grown on an epitaxially laterally overgrown GaN substrate," Applied Physics Letters, vol. 72, No. 2, Jan. 12, 1998, pp. 211-213.

Okamoto, K. et al., "Dislocation-free m-plane InGaN/GaN light-emitting diodes on m-plane GaN single crystals," Japanese Journal of Applied Physics, vol. 45, No. 45, 2006, pp. L1197-L1199.

Park, S., "Crystal orientation effects on electronic properties of wurtzite InGaN/GaN quantum wells," Journal of Applied Physics, vol. 91, No. 12, Jun. 15, 2002, pp. 9904-9908.

Park, S. "Crystal orientation effect on many-body optical gain of wurtzite InGaN/GaN quantum well lasers," Japan Journal of Applied Physics, vol. 42, 2003, pp. L170-L172.

Park, S. "Effect of (1010) crystal orientation on many-body optical gain of wurtzite InGaN/GaN quantum well," Journal of Applied Physics, vol. 93, No. 12, Jun. 15, 2003, pp. 9665-9668.

Suzuki, M. et al., "Biaxial strain effect on wurtzite GaN/AlGaN quantum well lasers," Japan Journal of Applied Physics, vol. 35, 1996, pp. 1420-1423.

Takeuchi, T. et al., "Quantum-confined stark effect due to piezoelectric fields in GaInN strained quantum wells," Japanese Journal of Applied Physics, vol. 36, 1997, pp. L382-L385.

Tsuda, Y. et al., "Blue laser diodes fabricated on m-plane GaN substrates," Applied Physics Express 1 (2008) pp. 011104-1-011104-3.

Yablonovitch, E. et al., "Reduction of lasing threshold current density by the lowering of valence band effective mass," Journal of Lightwave Technology, vol. LT-4, No. 5, May 1986, pp. 504-506.

European search report dated Aug. 29, 2013 for EP application No. 10749224.1.

Chinese Office Action (with English translation) for Chinese Patent Application No. 201080010051.2.

Japanese Office Action (with English translation) dated Feb. 21, 2014 for Japanese Patent Application No. 2011-553052.

* cited by examiner

METHOD OF IMPROVING SURFACE MORPHOLOGY OF (GA,AL,IN,B)N THIN FILMS AND DEVICES GROWN ON NONPOLAR OR SEMIPOLAR (GA,AL,IN,B)N SUBSTRATES

CROSS-REFERENCE TO RELATED APPLICATION

This application claims the benefit under 35 U.S.C. Section 119(e) of the following commonly assigned U.S. Provisional Patent Applications:

U.S. Provisional Patent Application Ser. No. 61/156,710, filed on Mar. 2, 2009, by Robert M. Farrell, Michael Iza, James S. Speck, Steven P. DenBaars, and Shuji Nakamura, entitled "METHOD OF IMPROVING SURFACE MORPHOLOGY OF (Ga,Al,In,B)N THIN FILMS AND DEVICES GROWN ON NONPOLAR OR SEMIPOLAR (Ga,Al,In,B)N SUBSTRATES,"; and U.S. Provisional Patent Application Ser. No. 61/184,535, filed on Jun. 5, 2009, by Robert M. Farrell, Michael Iza, James S. Speck, Steven P. DenBaars, and Shuji Nakamura, entitled "METHOD OF IMPROVING SURFACE MORPHOLOGY OF (Ga,Al,In,B)N THIN FILMS AND DEVICES GROWN ON NONPOLAR OR SEMIPOLAR (Ga,Al,In,B)N SUBSTRATES,";

which applications are incorporated by reference herein.

BACKGROUND OF THE INVENTION

1. Field of the Invention

This invention relates to semiconductor materials, methods, and devices, and more particularly, to the growth of nonpolar or semipolar nitride Light Emitting Diodes (LEDs) and diode lasers.

2. Description of the Related Art (Note: This application references a number of different publications as indicated throughout the specification by one or more reference numbers within brackets, e.g., [Ref(s). x]. A list of these different publications ordered according to these reference numbers can be found below in the section entitled "References." Each of these publications is incorporated by reference herein.)

The usefulness of gallium nitride (GaN) and alloys of (Ga,Al,In,B)N has been well established for fabrication of visible and ultraviolet optoelectronic devices and high power electronic devices. Current state-of-the-art nitride thin films, heterostructures, and devices are grown along the [0001] axis. The total polarization of such films consists of spontaneous and piezoelectric polarization contributions, both of which originate from the single polar [0002] axis 100 of the würtzite nitride crystal structure 102, as illustrated in FIG. 1(a). When nitride heterostructures are grown pseudomorphically, polarization discontinuities are formed at surfaces (e.g. c-plane surface 104, as shown in FIG. 1(a) and interfaces within the crystal 102. These discontinuities lead to the accumulation or depletion of carriers at surfaces and interfaces, which in turn produce electric fields. Since the alignment of these polarization-induced electric fields coincides with the typical [0001] growth direction of nitride thin films and heterostructures, these fields have the effect of "tilting" the energy bands of nitride devices.

In c-plane würtzite nitride quantum wells, the "tilted" energy bands spatially separate the electron wavefunction 106 and hole wavefunction 108, as illustrated in FIG. 1(b). This spatial charge separation reduces the oscillator strength of radiative transitions and red-shifts the emission wavelength. These effects are manifestations of the quantum confined Stark effect (QCSE) and have been thoroughly analyzed for nitride quantum wells [Refs. 5-8]. Additionally, the large polarization-induced electric fields can be partially screened by dopants and injected carriers [Refs. 9, 10], making the emission characteristics difficult to engineer accurately.

Furthermore, it has been theoretically predicted that pseudomorphic biaxial strain has little effect on reducing the effective hole mass in c-plane würtzite nitride quantum wells [Ref 11]. This is in stark contrast to typical III-V zinc-blende InP-based and GaAs-based quantum wells, where anisotropic strain-induced splitting of the heavy hole and light hole bands leads to a significant reduction in the effective hole mass. A reduction in the effective hole mass leads to a substantial increase in the quasi-Fermi level separation for any given carrier density in typical III-V zinc-blende InP- and GaAs-based quantum wells. As a direct consequence of this increase in quasi-Fermi level separation, much smaller carrier densities are needed to generate optical gain [Ref. 12]. However, in the case of the würtzite nitride crystal structure, the hexagonal symmetry and small spin-orbit coupling of the nitrogen atoms in biaxially strained c-plane nitride quantum wells produces negligible splitting of the heavy hole and light hole bands [Ref 11]. Thus, the effective hole mass remains much larger than the effective electron mass in biaxially strained c-plane nitride quantum wells, and very high current densities are needed to generate optical gain in c-plane nitride diode lasers.

One approach to decreasing polarization effects in nitride devices is to grow the devices on nonpolar planes of the crystal. These include the {11-20} planes, known collectively as a-planes, and the {10-10} planes, known collectively as m-planes. Such planes contain equal numbers of gallium and nitrogen atoms per plane and are charge-neutral. Subsequent nonpolar layers are equivalent to one another so the bulk crystal will not be polarized along the growth direction.

Another approach to reducing polarization effects and effective hole masses in nitride devices is to grow the devices on semipolar planes of the crystal. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero 1 Miller index. Subsequent semipolar layers are equivalent to one another so the bulk crystal will have reduced polarization along the growth direction.

Unlike strained c-plane $In_xGa_{1-x}N$ quantum wells, it has been predicted that strained nonpolar or semipolar $In_xGa_{1-x}N$ quantum wells should exhibit anisotropic splitting of the heavy hole and light hole bands, which should lead to a reduction in the effective hole mass for such structures [Ref 13]. Self-consistent calculations of many-body optical gain for compressively strained $In_xGa_{1-x}N$ quantum wells suggest that the peak gain is very sensitive to effective hole mass and net quantum well polarization, and that peak gain should increase dramatically as the angle between a general growth orientation and the c-axis increases, reaching a maximum for growth orientations perpendicular to the c-axis (i.e. on nonpolar planes) [Refs. 14, 15].

Finally, commercial c-plane nitride LEDs do not exhibit any degree of optical polarization in their electroluminescence. Nonpolar or semipolar nitride LEDs, on the other hand, have demonstrated strong optical polarization in their electroluminescence [Refs. 16-18]. This optical polarization can be attributed to anisotropic strain-induced splitting of the heavy hole and light hole bands in compressively strained nonpolar or semipolar $In_xGa_{1-x}N$ quantum wells, leading to significant discrepancies in the magnitude of different optical matrix elements.

However, current state of the art nonpolar or semipolar (Ga,Al,In,B)N substrates exhibit unusual surface morphologies [Refs. 2-4].

FIGS. 2(a)-(c) are taken from [Ref 2], wherein FIG. 2(a) and FIG. 2(b) are Nomarski optical micrographs showing the top surface of an m-plane n-type GaN film and m-plane LED structure, respectively, showing pyramidal hillocks 200, and FIG. 2(c) is a schematic illustration showing the cross-section of the pyramidal hillocks 200 having a height h, width w, and length l, and the m-plane GaN film is grown on nominally on-axis m-plane GaN substrates.

FIGS. 3(a)-(g) are also taken from [Ref 2], wherein FIG. 3(a) shows an amplitude image of an n-type GaN film over a 10×10 µm² area showing four pyramid faces (two a-inclined faces $a_1$ and $a_2$, and two c-inclined faces $c^+$ and $c^-$), wherein the slope angles of the pyramids are 0.1° for the a-inclined pyramid faces and 0.5°-0.6° for the c-inclined faces, FIG. 3(b) is an amplitude image of an m-plane LED structure, FIGS. 3(c)-(f) are height images for the $c^-$, $a_1$, $a_2$, and $c^+$ inclined faces of the LED structure in FIG. 3(b), respectively, and FIG. 3(g) is a schematic showing the $c^-$ and $c^+$-inclined hillock faces were decorated with microscopic pyramids (plan view and cross-section of the hillocks in FIGS. 3(d), (e), and (f)).

FIGS. 4(a)-(b) are also taken from [Ref 2] and show a series of Nomarski optical micrographs of m-plane GaN films grown on off-axis substrates with different miscut directions and miscut angles, wherein in FIG. 4(a) the a-miscut angles range from 0° to 0.35° in 0.1° increments and 0.52° (from left to right), and in FIG. 4(b) the $c^-$ miscut angles are 0.01°, 0.45°, 5.4°, and 9.7°, from left to right, respectively.

FIG. 5 is taken from [Ref 3] and shows a surface morphology of an m-plane GaN substrate after epitaxial growth of a laser structure observed by optical differential contrast microscopy.

FIGS. 6(a)-(b) are taken from [Ref. 4], wherein FIG. 6(a) and FIG. 6(b) are Nomarski optical micrographs of m-plane GaN grown on off-angled substrate with orientations 0.2° and 2.2° toward the <0001> direction, respectively.

There is a need to provide smoother nonpolar and semipolar films. The present invention satisfies this need.

SUMMARY OF THE INVENTION

This invention describes a method for improving the surface morphology of (Ga,Al,In,B)N thin films on nonpolar or semipolar (Ga,Al,In,B)N substrates. The obtained smooth (Ga,Al,In,B)N thin films can serve as a template for the growth of high performance nonpolar or semipolar nitride LEDs and diode lasers. Common vapor phase epitaxy techniques, such as metalorganic chemical vapor deposition (MOCVD) and hydride vapor phase epitaxy (HVPE), can be used to grow the (Ga,Al,In,B)N thin films. However, the invention is equally applicable to (Ga,Al,In,B)N thin films growth by any other suitable vapor phase growth technique.

Growth of nonpolar or semipolar nitride thin films and heterostructures offers a means of decreasing polarization effects and reducing the effective hole mass in würtzite nitride device structures. The terms "nitrides," "(Ga,Al,In,B)N", or "III-Nitride" refers to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$. Current commercially-available LEDs and diode lasers are grown along the polar [0001] c-direction. The associated polarization-induced electric fields and the inherently large effective hole mass are detrimental to the performance of state-of-the-art nitride LEDs and diode lasers. Growth of these devices on nonpolar or semipolar planes can significantly improve device performance by decreasing polarization-induced electric fields and reducing the effective hole mass.

For high-temperature growth of c-plane (Ga,Al,In,B)N on sapphire, most groups report using 100% $H_2$ as the carrier gas. Under typical growth conditions, the use of 100% $H_2$ as the carrier gas yields c-plane (Ga,Al,In,B)N epitaxial layers with the lowest dislocation densities and smoothest epitaxial surfaces [Ref. 1]. However, when typical c-plane (Ga,Al,In,B)N growth conditions are used for the regrowth of (Ga,Al,In,B)N on nonpolar or semipolar (Ga,Al,In,B)N substrates, unusual surface morphologies can occur [Refs. 2-4].

This invention describes a method for improving the growth morphology of (Ga,Al,In,B)N thin films on nonpolar or semipolar (Ga,Al,In,B)N substrates by using an inert carrier gas such as $N_2$. For example, the present invention is able to improve surface smoothness of nonpolar and semipolar films as compared to films grown in [Refs. 2-4].

Improved surface morphology can lead to a number of advantages for nonpolar or semipolar nitride device manufacturers, including, but not limited to, better uniformity in the thickness, composition, doping, electrical properties, and luminescence characteristics of individual layers in a given device. Furthermore, smooth surfaces can be especially beneficial for nonpolar or semipolar nitride laser diodes, leading to significant reductions in optical scattering losses.

Thus, to overcome the limitations in the prior art described above, and to overcome other limitations that will become apparent upon reading and understanding the present specification, the present invention discloses a method for fabricating a (Ga,Al,In,B)N thin film, comprising growing a (Ga,Al,In,B)N thin film directly on a nonpolar or semipolar (Ga,Al,In,B)N substrate or template, and using a carrier gas during the growing step, wherein at least a portion of the carrier gas is comprised of an inert gas.

The method may further comprise providing the substrate or template with a miscut away from a low index crystal orientation. For example, the substrate or template may be an m-plane substrate or template, the miscut may have a miscut angle toward the [000-1] direction between 0.75° and 1.50°, the (Ga,Al,In,B)N film may be grown on a surface of the miscut.

The inert gas may be comprised of one or more of the following: Nitrogen ($N_2$), Helium (He), Neon (Ne), Argon (Ar), Krypton (Kr), or Xenon (Xe). A portion or 100% of the carrier gas may be the inert gas, for example.

One or more device layers may be deposited on the top surface of the film, and the device layers may be grown with at least a portion (or 100%) of the carrier gas being comprised of $H_2$ and/or $N_2$. The one or more device layers may comprise one or more p-type doped layers of the device and the p-type doped layers may be grown with at least a portion (or 100%) of the carrier gas being comprised of $H_2$.

The present invention further discloses a nonpolar or semipolar (Ga,Al,In,B)N film comprising a top surface that is a nonpolar or semipolar plane, having a planar and optically smooth area, such that the area has an absence of identifiable non-planar surface undulations or features as measured using an optical microscope and with light wavelengths between 400 nanometers and 600 nanometers, wherein the area is sufficiently large for use as a substrate for epitaxial deposition of one or more device layers on the area of the top surface, and the device layers emit light having an output power of at least 2 milliwatts at 20 milliamps (mA) drive current.

The area may have an absence of striations.

The area may be at least 100 micrometers squared, for example. The top surface may be atomically smooth with a surface roughness on the order of a diameter of Ga,Al,In,B, and N atoms at the top surface, over the area of 100 micrometers squared. The top surface may have a surface roughness with a root mean square (RMS) of less than 0.5 or 0.25 nanometers (nm) over the area of 100 micrometers squared.

The top surface may be smoother and more planar than a top surface shown in FIGS. 2(a), 2(b), 3(a)-3(f), 4(a)-4(b), 5, 6(a), 6(b), 7(a)-7(c), 8(a)-8(c), or 9(d)-9(f). The top surface may be smoother than a surface characterized pyramidal hillocks having a density of $8.4 \times 10^2$ cm$^{-2}$ or $1.1 \times 10^6$ cm$^{-2}$, a size of 10 micrometers and/or a slope angle of 0.1°. The top surface may have a smoothness or surface roughness at least as smooth as the surface shown in FIGS. 7(d)-7(f), 8(d)-8(f), or 9(a)-9(c).

The film may be deposited on a surface of an m-plane substrate, and the surface of the m-plane substrate may be a miscut with a miscut angle between 0.75° and 1.50° toward a [000-1] direction.

The film may be an m-plane GaN film and the top surface may be an m-plane of the m-plane GaN film. The surface smoothness or roughness of the top surface is typically as grown. A top surface of the device layers may be at least as smooth as the top surface of the film.

BRIEF DESCRIPTION OF THE DRAWINGS

Referring now to the drawings in which like reference numbers represent corresponding parts throughout:

FIGS. 7(a)-7(f) and 8(a)-8(f) comprise optical micrographs (scale 125 micrometers (μm)) illustrating the effects of carrier gas and miscut angle on the surface morphology of GaN thin films grown on free-standing m-plane GaN substrates, wherein FIGS. 7(a)-7(c) and FIGS. 8(a)-8(c) are fabricated with $H_2$ carrier gas, FIGS. 7(d)-7(f) and FIGS. 8(d)-8(f) are fabricated with $N_2$ carrier gas, FIGS. 7(a) and 7(d) are fabricated on a substrate with −0.05° miscut, FIGS. 7(b) and 7(e) are fabricated on a substrate with 0.45° miscut, FIGS. 7(c) and 7(f) are fabricated on a substrate with 0.61° miscut, FIGS. 8(a) and 8(d) are fabricated on a substrate with 1.03° miscut, FIGS. 8(b) and 8(e) are fabricated on a substrate with 1.88° miscut, and FIGS. 8(c) and 8(f) are fabricated on a substrate with 2.30° miscut, wherein all miscuts are toward the [000-1] direction.

DETAILED DESCRIPTION OF THE INVENTION

Figure 1A:
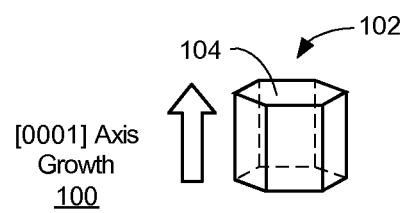
FIG. 1(a) is a schematic of wurtzite nitride crystal structure and FIG. 1(b) is a schematic illustration of the band bending in compressively strained $In_xGa_{1-x}N$ quantum wells due to polarization-induced electric fields, wherein $E_c$ is the conduction band and $E_v$ is the valence band.
Figure 1B:
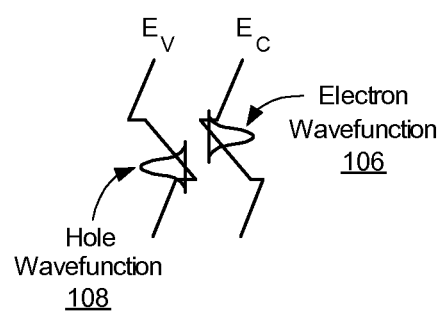

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The realization of nonpolar or semipolar nitride LEDs and diode lasers allows for multiple advances in the manufacturability of nitride LEDs and diode lasers. Growth of nitride LEDs and diode lasers on a nonpolar or semipolar planes can significantly improve device performance by decreasing polarization-induced electric fields and reducing the effective hole mass through anisotropic strain-induced splitting of the heavy hole and light hole bands. Decreasing polarization-induced electric fields can increase the radiative efficiency in nitride LEDs. Likewise, decreasing polarization-induced electric fields and reducing the effective hole mass can decrease the current densities necessary to generate optical gain in nitride diode lasers. This can lead to significantly less heating in nitride LEDs and diode lasers, which can result in longer device lifetimes and higher production yields for device manufacturers.

However, with the unusual surface morphologies typically observed for (Ga,Al,In,B)N thin films grown on nonpolar or semipolar (Ga,Al,In,B)N substrates [Refs. 2-4], it will be difficult for device manufacturers to realize the expected advantages of nonpolar or semipolar nitride devices. This invention describes a method for improving the surface morphology of (Ga,Al,In,B)N thin films on nonpolar or semipolar (Ga,Al,In,B)N substrates. Improved surface morphology can lead to a number of advantages for nonpolar or semipolar nitride device manufacturers, including, but not limited to, better uniformity in the thickness, composition, doping, electrical properties, and luminescence characteristics of individual layers in a given device. Therefore, the present invention enables the realization of the aforementioned benefits of nonpolar or semipolar nitride LEDs and diode lasers.

A purpose of this invention is to generate nitride LEDs and diode lasers with improved manufacturability and high performance. The proposed devices will be used as an optical source for various commercial, industrial, or scientific applications. These nonpolar or semipolar nitride LEDs and diode lasers can be expected to find utility in the same applications as c-plane nitride LEDs and diode lasers. These applications include solid-state projection displays, high resolution printers, high density optical data storage systems, next generation DVD players, high efficiency solid-state lighting, optical sensing applications, and medical applications.

Technical Description

The present invention describes a method for improving the growth morphology of (Ga,Al,In,B)N thin films and devices on nonpolar or semipolar (Ga,Al,In,B)N substrates by using an inert carrier gas. The present invention has experimentally demonstrated these effects for GaN thin films and devices grown by MOCVD on free-standing m-plane GaN substrates manufactured by Mitsubishi Chemical Co., Ltd. These substrates were grown by HVPE in the c-direction and then sliced to expose the m-plane surface. The m-plane surface was prepared by chemical and mechanical surface treatment techniques. The substrates have threading dislocation densities of less than $5 \times 10^6$ cm$^{-2}$, carrier concentrations of approximately $1 \times 10^{17}$ cm$^{-3}$, and a RMS surface roughness of less than 1 nm, as measured by the manufacturer.

Aside from changes in the carrier gas, the MOCVD growth conditions were very similar to those typically used for c-plane (Ga,Al,In,B)N thin films. All MOCVD growth was performed at atmospheric pressure (AP), at typical V/III ratios (>3000), and at typical growth temperatures (>1000° C.). Trimethylgallium (TMGa), ammonia (NH$_3$), and silane (SiH$_4$) were used as the Ga, N, and Si precursors, respectively. Two GaN template growths were performed with different carrier gases to determine the effects of carrier gas on surface morphology. For both growths, several free-standing m-plane substrates with a range of intentional miscuts in the [000-1] direction were simultaneously loaded into the MOCVD reactor. After ramping the samples up to the growth temperature in an atmosphere consisting of NH$_3$ and the carrier gas, Si-doped GaN thin films of approximately 10 μm thickness were grown on top of the free-standing m-plane GaN substrates. The GaN thin films were grown at high temperature directly on top of the free-standing m-plane GaN substrates, without the use of a low temperature GaN nucleation layer. During the course of the growth, all carrier gases and precursors were held at constant flow rates. Finally, at the p of the growth of the GaN thin films, the samples were ramped back down to room temperature in an environment consisting of NH$_3$ and N$_2$.

FIGS. 7(a)-7(f) and 8(a)-8(f) comprise optical micrographs illustrating the effects of carrier gas and miscut angle on the surface morphology of GaN thin films 700a, 700b, 700c, 700d, 700e, 700f, 800a, 800b, 800c, 800d, 800e, and 800f, respectively, grown on free-standing m-plane GaN substrates. The listed angles correspond to the miscut of the substrates toward the [000-1] direction. Samples 700a-c and 800a-c shown in FIGS. 7(a)-7(c) and FIGS. 8(a)-8(c), respectively (6 samples in total) were fabricated by simultaneously loading free-standing m-plane GaN substrates into the MOCVD reactor and growing the GaN films 700a-700c and 800a-800c with a 100% H$_2$ carrier gas, while the samples 700d-700f and 800d-800f shown in FIGS. 7(d)-7(f) and FIGS. 8(d)-(f), respectively, (also 6 samples in total) were fabricated by simultaneously loading free-standing m-plane GaN substrates into the MOCVD reactor and growing the GaN films 700d-700f and 800d-800f with a 100% N$_2$ carrier gas. As can be seen from the micrographs, the choice of carrier gas had a considerable effect on the surface morphology. For samples 700a-700f with a small [000-1] miscut angle of less than 0.61°, using an H$_2$ carrier gas resulted in surfaces 702a, 702b, 702c with relatively large and continuous pyramidal hillocks 704a, 704b, 704c, respectively [Ref 2], while using an N$_2$ carrier gas resulted in surfaces 702d, 702e, and 702f with spatially separated, medium size pyramidal hillocks 706, 708, 710, respectively, and very small pyramidal hillocks 712, 714, 716, respectively, decorating the areas in between. For larger [000-1] miscut angles, using an H$_2$ carrier gas resulted in surfaces 802a, 802b, 802c with a very rough slate-like morphology 804a, 804b, 804c, respectively, while using an N$_2$ carrier gas resulted in optically smooth surfaces 802d, 802e, 802f with an absence of identifiable surface features, (e.g. over an area 806 of the surfaces 802d-802f).

FIGS. 9(a)-(f) comprise 10 μm×10 μm scans illustrating the effect of [000-1] miscut on atomic-level surface morphology 900a, 900b, 900c, 900d, 900e, and 900f of GaN films 902a, 902b, 902c, 902d, 902e, and 902f, respectively. On samples with pyramidal hillocks present, the AFM data was collected from the pyramidal facet facing the [000-1] direction, since this was the direction of miscut being studied. For films 902a-902c on substrates having [000-1] miscut angles smaller than about 1.5°, it was found that the sample surface 900a-c was very smooth on an atomic-level scale. However, for films 902d-902f on substrates having [000-1] miscut angles larger than approximately 1.5°, the surface morphology 900d-900f became dominated by a high density of lateral striations 904, 906, 908.

Figure 10:
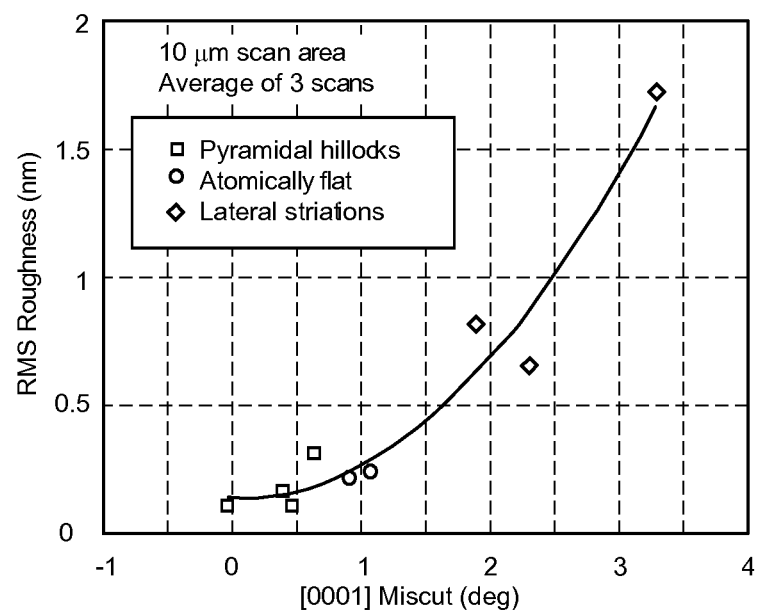
FIG. 10 shows the RMS roughness (nm) as a function of [000-1] miscut angle in degrees (i.e., miscut towards the [000-1] direction), showing miscut angles that produce pyramidal hillocks (squares), atomically flat surfaces (circles), and lateral striations (diamonds), for a 10 micrometer (μm) scan area, wherein each data point is an average of 3 scans.

FIG. 10 shows the RMS roughness as a function of [000-1] miscut angle. As can be seen from FIG. 10, the RMS roughness increases drastically for [000-1] miscut angles larger than 1.5°, mostly due to the high density of lateral striations 904, 906, 908. However, as shown in FIGS. 7(a)-7(c), samples 700a-700f with a [000-1] miscut angle less than 0.61° were covered with a high density of pyramidal hillocks 704a, 704b, 704c, 706, 708, 710, 712, 714, 716 despite their atomic-level smoothness. For these reasons, the present invention concludes that the optimal [000-1] miscut angle for m-plane growth is somewhere in between 0.75° and 1.5°.

Figure 11:
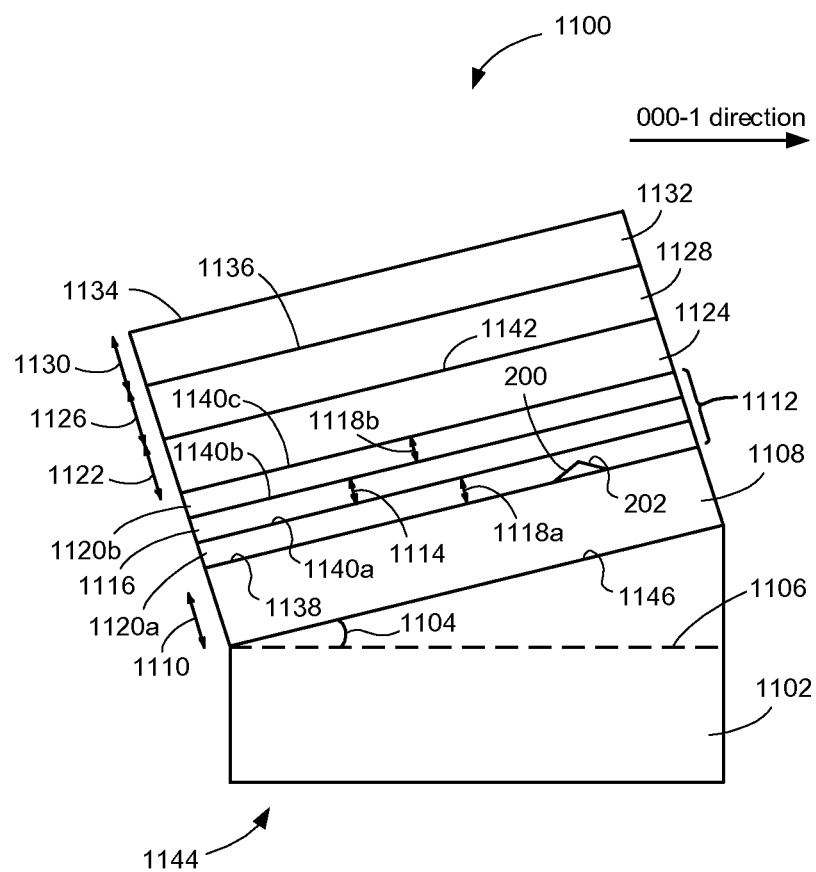
FIG. 11 is a cross-sectional schematic of an LED device structure according to the present invention.

Following the demonstration of smooth MOCVD-grown GaN films (e.g., 800d-800f), (Ga,Al,In,B)N laser structures were grown on top of the GaN films to establish the viability of the films as smooth templates as a base for growing high-quality (Ga,Al,In,B)N devices, as shown in FIG. 11.

For the device 1100 growth, several MOCVD-grown GaN templates 1102 with a range of intentional miscuts having an angle 1104 (with respect to a nonpolar plane, e.g., m-plane 1106) in the [000-1] direction were simultaneously loaded into the MOCVD reactor. After ramping the samples up to the growth temperature in an atmosphere consisting of NH$_3$ and the carrier gas, Si-doped GaN thin films 1108 of approximately 2 μm thickness 1110 were grown on top of the GaN templates 1102 in a 100% N$_2$ carrier gas. Following the growth of the Si-doped GaN layers 1108, a 5 period multiple-quantum-well (MQW) 1112 with 8 nm thickness 1114 InGaN wells 1116 and 8 nm thickness 1118a, 1118b GaN barriers 1120a, 1120b was grown in a 100% N$_2$ carrier gas. Next, a 15 nm thickness 1122 Mg-doped p-AlGaN electron blocking layer 1124 was grown in a 100% N$_2$ carrier gas. Finally, a 750 nm thick 1126 Mg-doped p-GaN layer 1128 and a 20 nm thick 1130 Mg-doped p$^{++}$-GaN contact layer 1132 were grown in a 100% H$_2$ carrier gas. Although the p-GaN 1128 and p$^{++}$-GaN contact layers 1132 were grown in a 100% H$_2$ carrier gas, the final epitaxial surfaces 1134, 1136 maintained the smooth morphology for the surfaces 1138, 1140a, 1140b, 1140c, and 1142 of the underlying (Ga,Al,In,B)N layers 1108, 1116, 1120*a*, 1120*b*, 1124 that were grown in a 100% N₂ carrier gas. The miscut has the surface 1146.

Following the MOCVD growth, the laser structures 1100 were fabricated into 300 μm×300 μm LEDs with 200/3000 Å Pd/Au p-contacts. All measurements were performed by on-wafer probing at an injection current of 20 mA. Relative optical power measurements under direct current (dc) conditions were obtained from the backside 1144 emission through the GaN substrates 1102 onto a calibrated broad area Si photodiode. FIGS. 12 through 15 summarize the electrical and optical properties of the laser structures as a function of template miscut.

Figure 12:
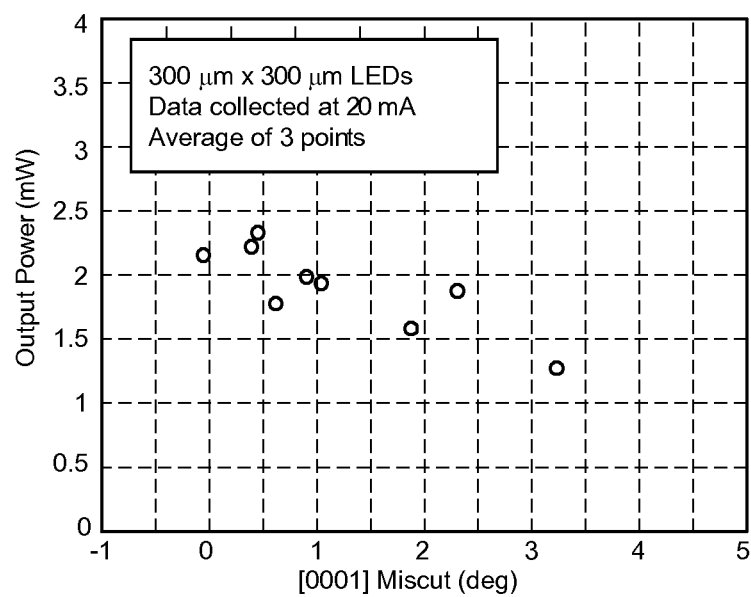
FIG. 12 is a graph showing output power (milliwatts, mW) as a function of [000-1] miscut angle (degrees) (i.e., miscut towards the [000-1] direction), for 300 μm×300 μm size LEDs, wherein data is collected at 20 mA drive current and each data point is an average of 3 data points.
Figure 13:
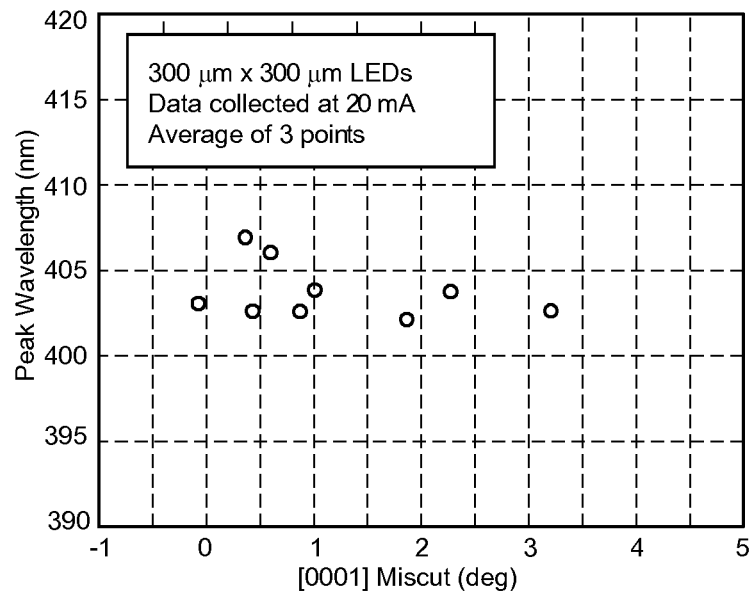
FIG. 13 is a graph showing Electroluminescence (EL) peak wavelength (nm) as a function of [000-1] miscut (i.e., miscut towards the [000-1] direction), for 300 μm×300 μm size LEDs, wherein data is collected at 20 mA drive current and each data point is an average of 3 data points.
Figure 14:
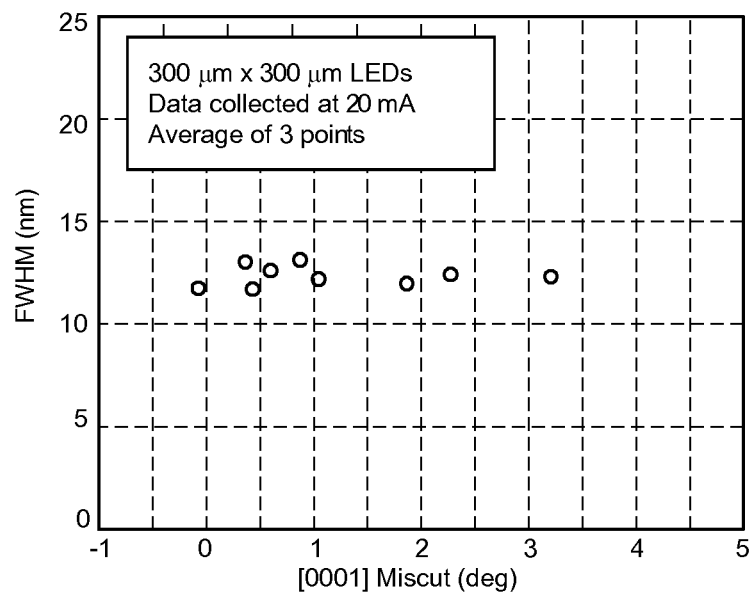
FIG. 14 is a graph showing EL Full-Width-at-Half-Maximum (FWHM) (nm) as a function of [000-1] miscut (i.e., miscut towards the [000-1] direction), for 300 μm×300 μm size LEDs, wherein data is collected at 20 mA drive current and each data point is an average of 3 data points.
Figure 15:
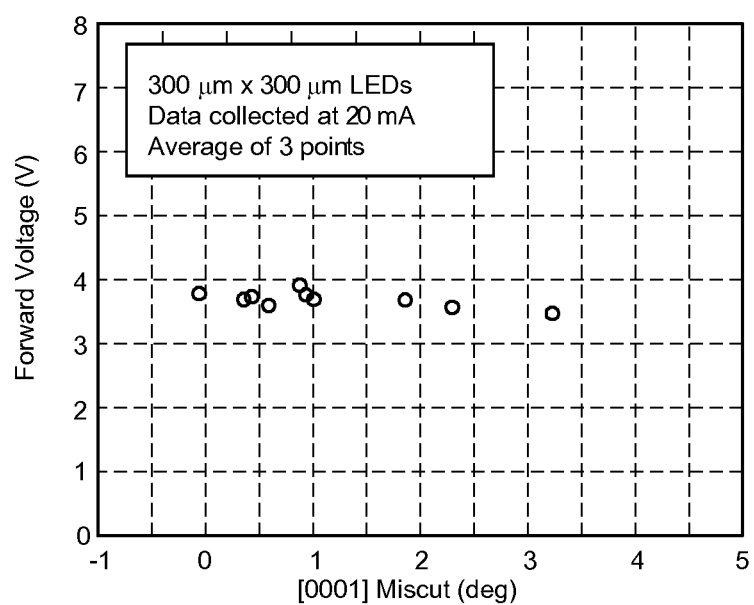
FIG. 15 is a graph showing forward voltage (V) as a function of [000-1] miscut (i.e., miscut towards the [000-1] direction).

As shown in FIG. 12, the relative optical power decreased slightly with increasing template miscut. However, this measured decrease in output power may be due to a reduction in extraction efficiency due to a decrease in surface roughness with increasing template orientation. FIGS. 13 and 14 summarize the EL spectra as a function of template miscut 1104. As illustrated in the FIGS. 13 and 14, both the EL peak wavelength and EL FWHM were very uniform with increasing template miscut. Finally, as shown in FIG. 15, the forward voltage at 20 mA remained relatively low and constant with increasing miscut angle.

One embodiment of the present invention comprises growing (Ga,Al,In,B)N thin films on free-standing nonpolar or semipolar (Ga,Al,In,B)N substrates. However, the scope of this invention also includes nonpolar or semipolar (Ga,Al,In,B)N thin films grown all possible crystallographic orientations of all possible foreign substrates.

Process Steps

Figure 16:
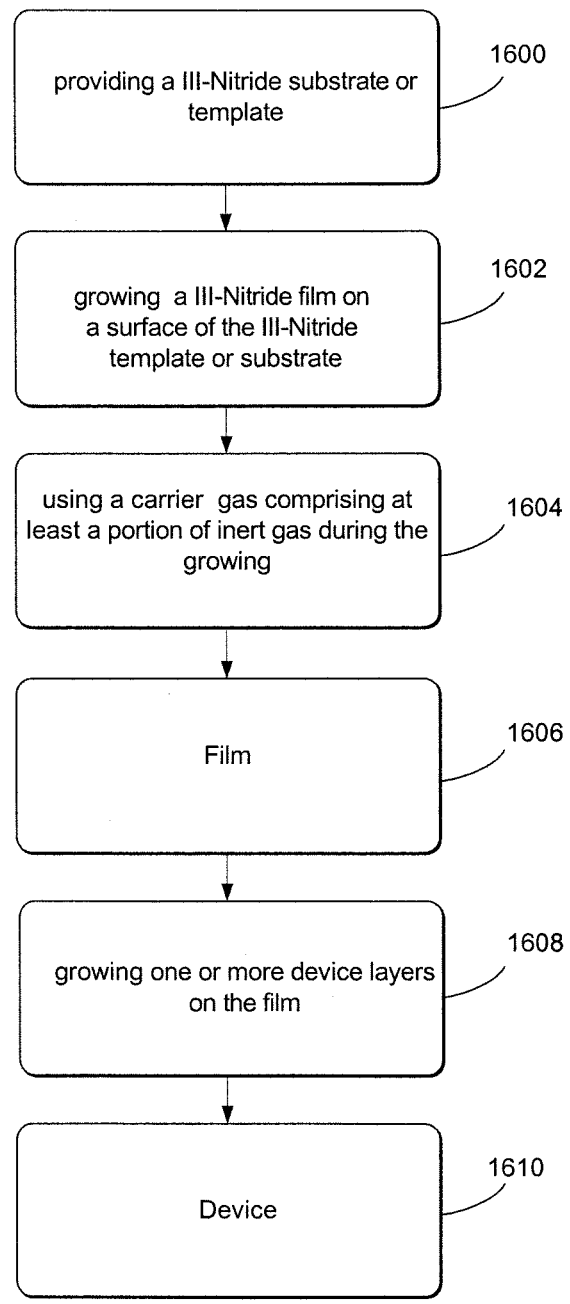
FIG. 16 is a flowchart illustrating a method of the present invention.

FIG. 16 is a flowchart illustrating a method of fabricating a device (e.g. (Ga,Al,In,B) film) according to one embodiment of the present invention. The method may comprise the following steps.

Block 1600 represents the step of providing a nonpolar or semipolar substrate or template with a miscut away from a low index crystal orientation. For example, the substrate or template 1102 is typically an m-plane substrate or template having a miscut with the miscut angle 1104 toward the [000-1] direction between 0.75° and 1.50° (the miscut typically has a magnitude, direction and a surface 1146). The substrate may be a (Ga,Al,In,B)N substrate, e.g., a free-standing (Ga,Al,In,B)N substrate. The (Ga,Al,In,B)N substrate may be created by removing a foreign substrate from a thick nonpolar or semipolar (Ga,Al,In,B)N layer or by sawing a bulk (Ga,Al,In,B)N ingot or boule into individual nonpolar or semipolar (Ga,Al,In,B)N wafers. The template may be a (Ga,Al,In,B)N template, for example, on a foreign substrate. The (Ga,Al,In,B)N template may be grown by epitaxial lateral overgrowth (ELO), for example.

Block 1602 represents the step of growing a (Ga,Al,In,B)N (e.g., thin) film (e.g., directly) on the nonpolar or semipolar (Ga,Al,In,B)N substrate or template. The (Ga,Al,In,B)N film 1108 may be on a surface (e.g. miscut having the surface 1146) of the nonpolar or semipolar (Ga,Al,In,B)N substrate or template 1102.

Block 1604 represents the step of using a carrier gas during the growing step of Block 1102, wherein at least a portion of the carrier gas used during growth is comprised of an inert gas. The inert gas may be comprised of N₂, He, Ne, Ar, Kr, and/or Xe. 100% of the carrier gas may be the inert gas, for example.

The composition of the carrier gas, and/or the direction and/or the magnitude of the miscut, may be chosen to affect at least one of the following properties of the (Ga,Al,In,B)N thin film and/or any subsequent layers: the surface morphology, growth rate, alloy composition, luminescence characteristics, and electrical properties.

The (Ga,Al,In,B)N thin film may comprise multiple layers having varying or graded compositions. The (Ga,Al,In,B)N thin film may be grown on a Ga-polarity plane or an N-polarity plane, for example. The (Ga,Al,In,B)N thin film may be doped with elements such as Fe, Si, Zn, and/or Mg. However, the (Ga,Al,In,B)N thin film may also be not intentionally doped. The (Ga,Al,In,B)N thin film may contain a nucleation or buffer layer.

Block 1606 represents the film fabricated by the preceding steps. The (Ga,Al,In,B)N thin film may be used as a substrate for subsequent growth, such as that by hydride vapor phase epitaxy (HVPE), metal organic chemical vapor deposition (MOCVD), and/or molecular beam epitaxy (MBE), for example.

The film 1108, e.g. of Block 1606, may be a nonpolar or semipolar (Ga,Al,In,B)N film comprising a top surface 1138 that is a nonpolar or semipolar plane, having a planar and optically smooth area, such that the area has an absence of identifiable non-planar surface undulations or features 200, 704*a-c*, 706, 708, 710, 712, 714,716, as measured using an optical microscope with light wavelengths between 400 nm and 600 nm, wherein the area is sufficiently large for use as a substrate for epitaxial deposition of one or more device layers 1112, 1116, 1124, 1128, 1132 on the area of the top surface 1138, and the device layers 1116 emit light having an output power of at least 2 milliwatts at 20 milliamps drive current. The area may be the area 806 of the surface 802*d-f* shown in FIGS. 8(*d*)-(*f*), or the area of the surface morphology 900*a-c* shown in FIGS. 9(*a*)-(*c*) e.g., at least 100 micrometers squared.

The top surface 1138 may be atomically smooth with a surface roughness on the order of a diameter of Ga,Al,In,B, and N atoms at the top surface 1138, over the area of 100 micrometers squared. The area may have an absence of striations, e.g. lateral striations 904, 906, 908. The top surface 1138 may have a surface roughness with an RMS of less than 0.5 nm, or 0.25 nm, for example, over the area of 100 micrometers squared.

The film 1108 may be deposited on a surface 1146 of an m-plane substrate 1102, and the surface 1146 may be a miscut of the m-plane substrate with a miscut angle 1104 between 0.75° and 1.50° toward a [000-1] direction.

Figure 2:
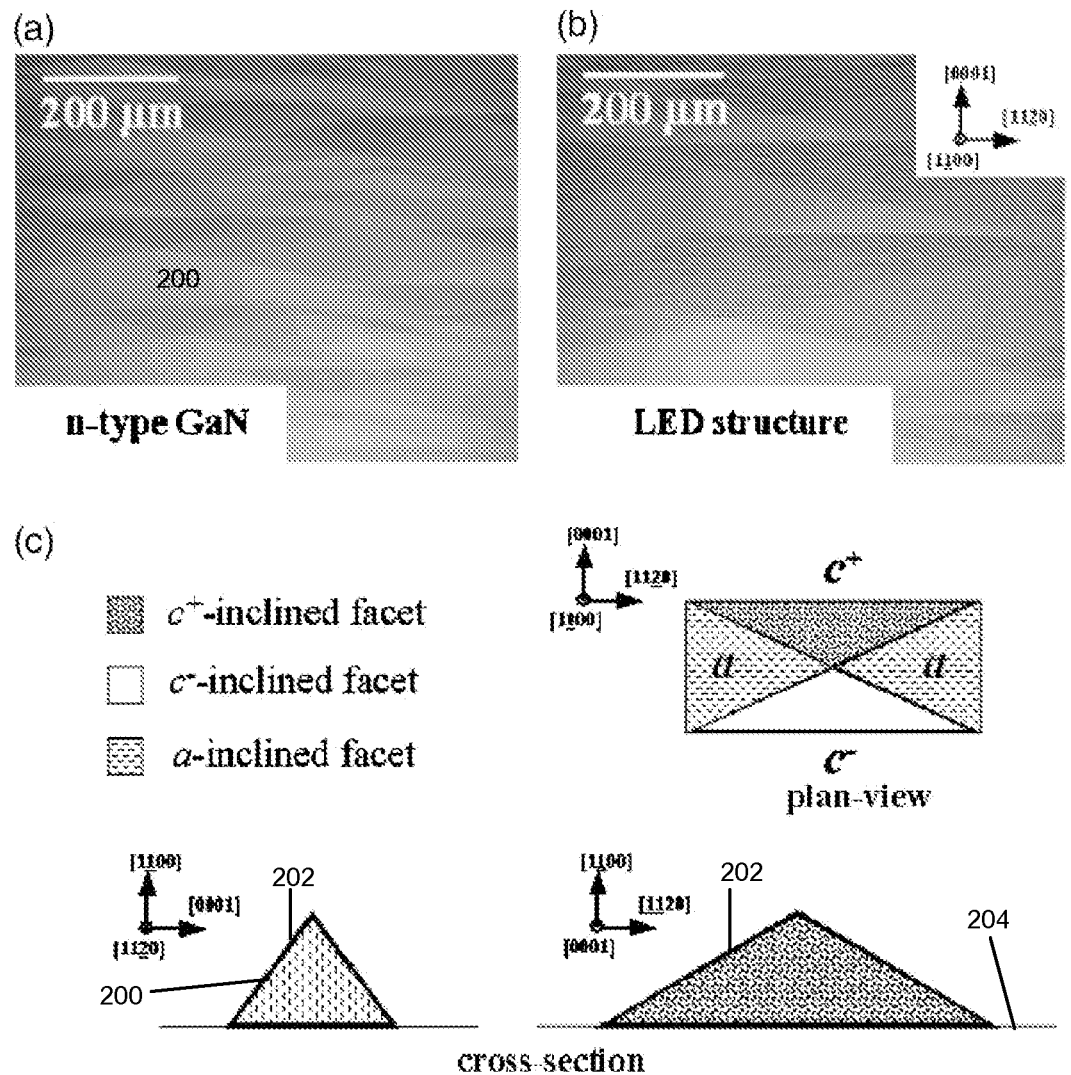
FIGS. 2(a)-2(c), 3(a)-3(g), 4(a)-4(b), 5, and 6(a)-6(b) are images of surface morphologies of GaN films and LED structures fabricated in [Refs. 2-4].
Figure 3:
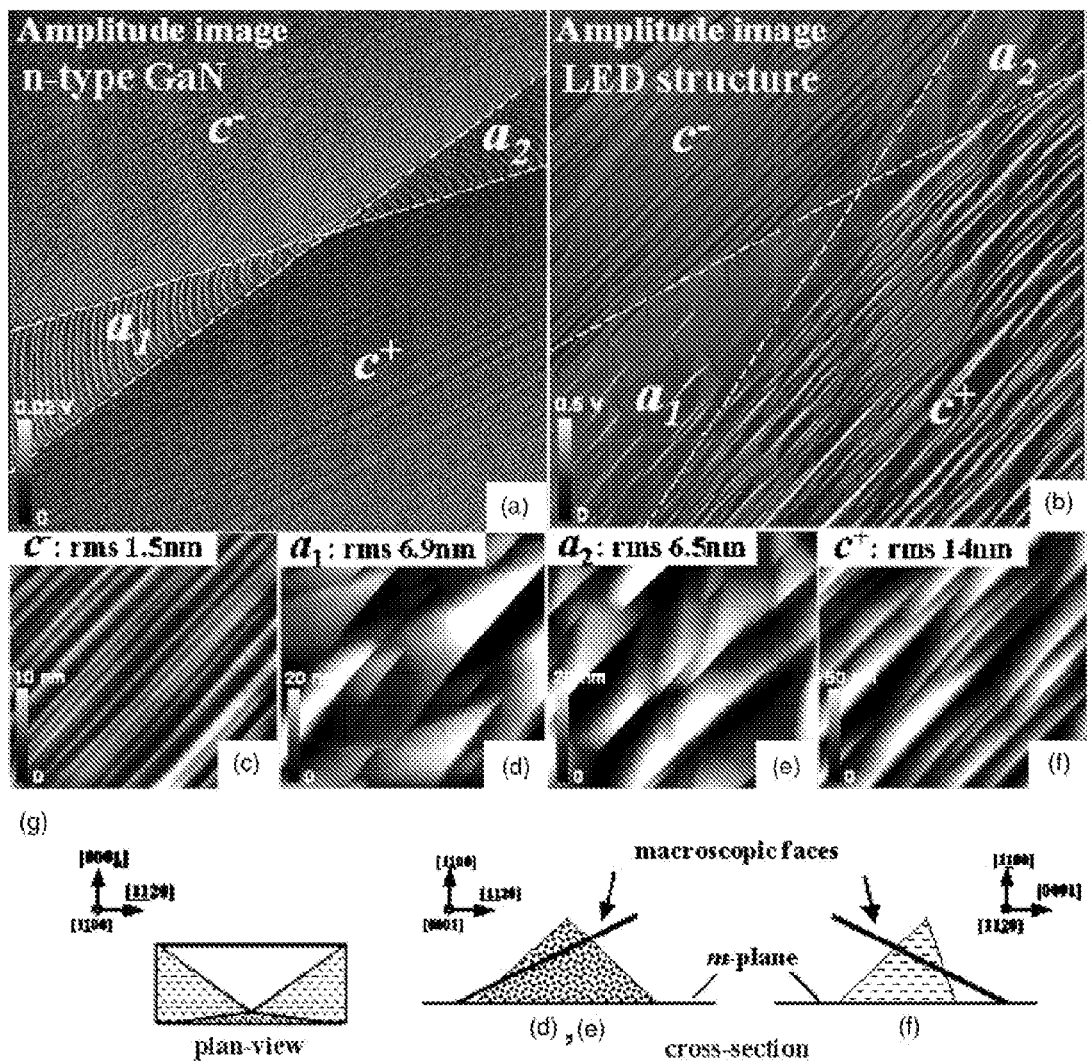
Figure 4:
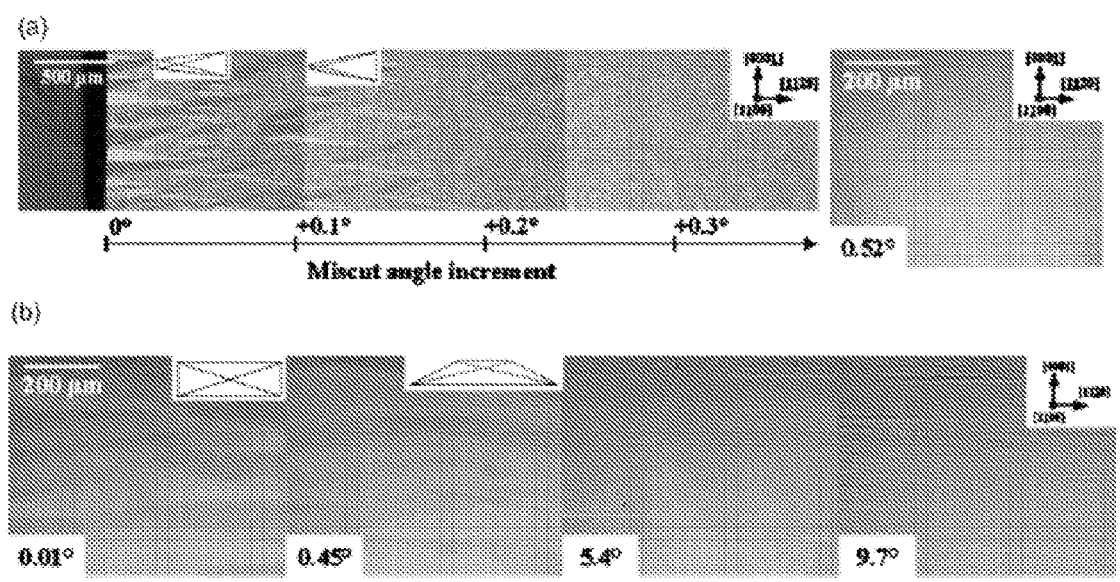
Figure 5:
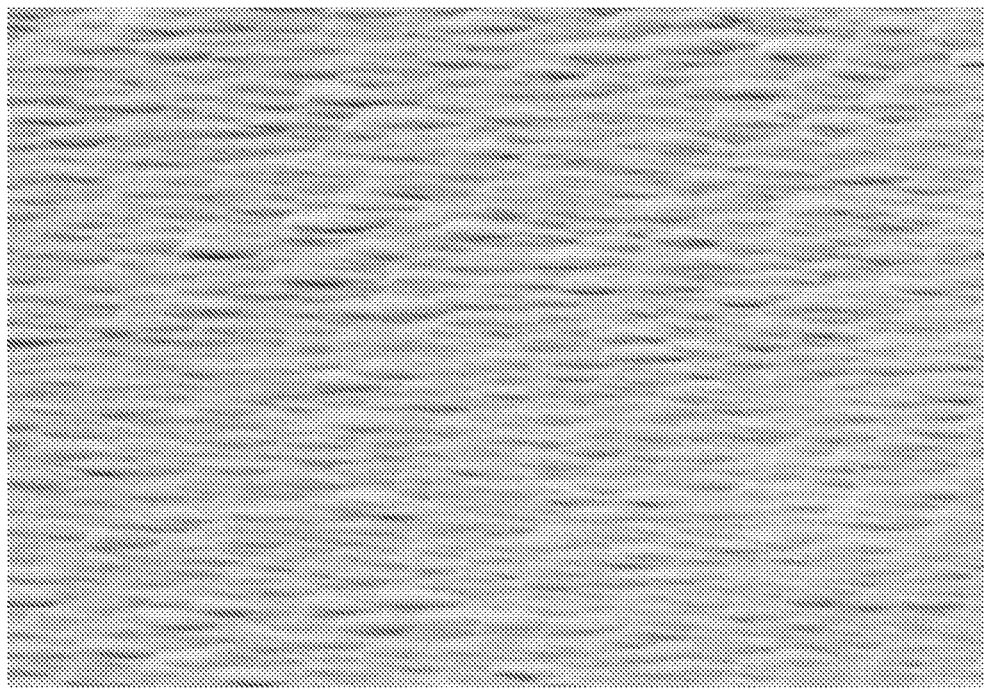
Figure 6:
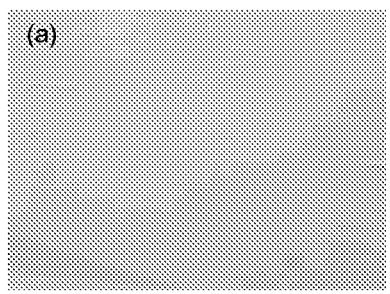
Figure 6:
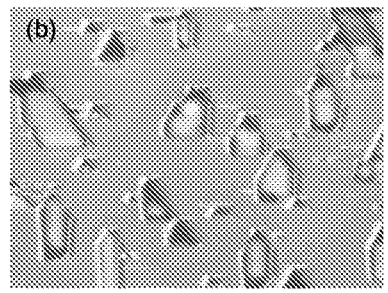
Figure 7:
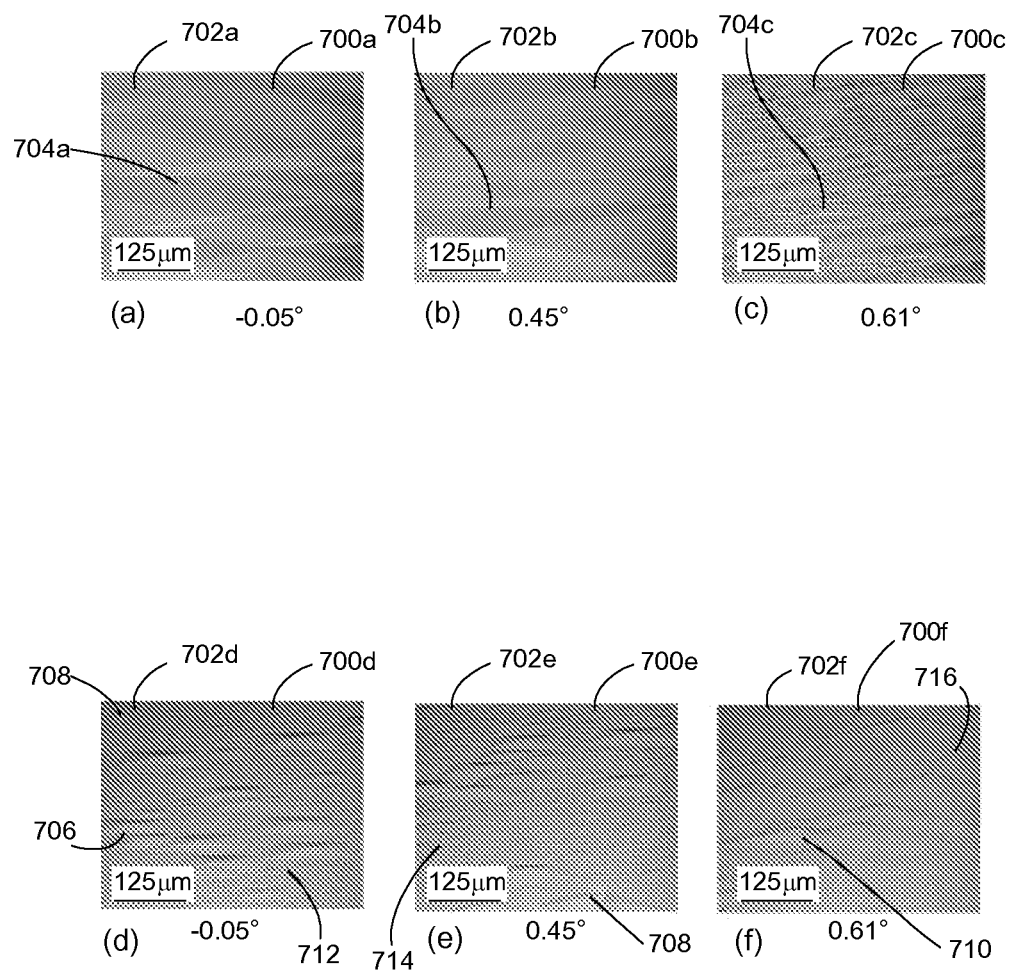
Figure 8:
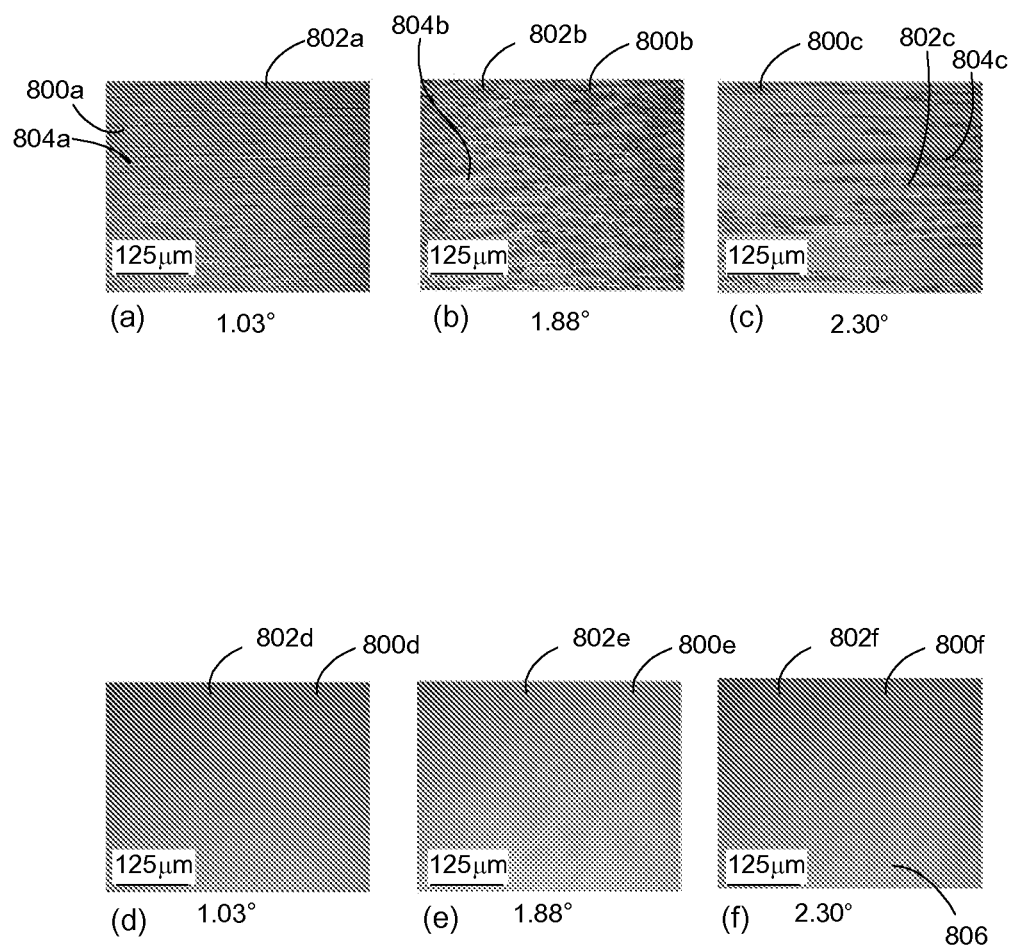
Figure 9:
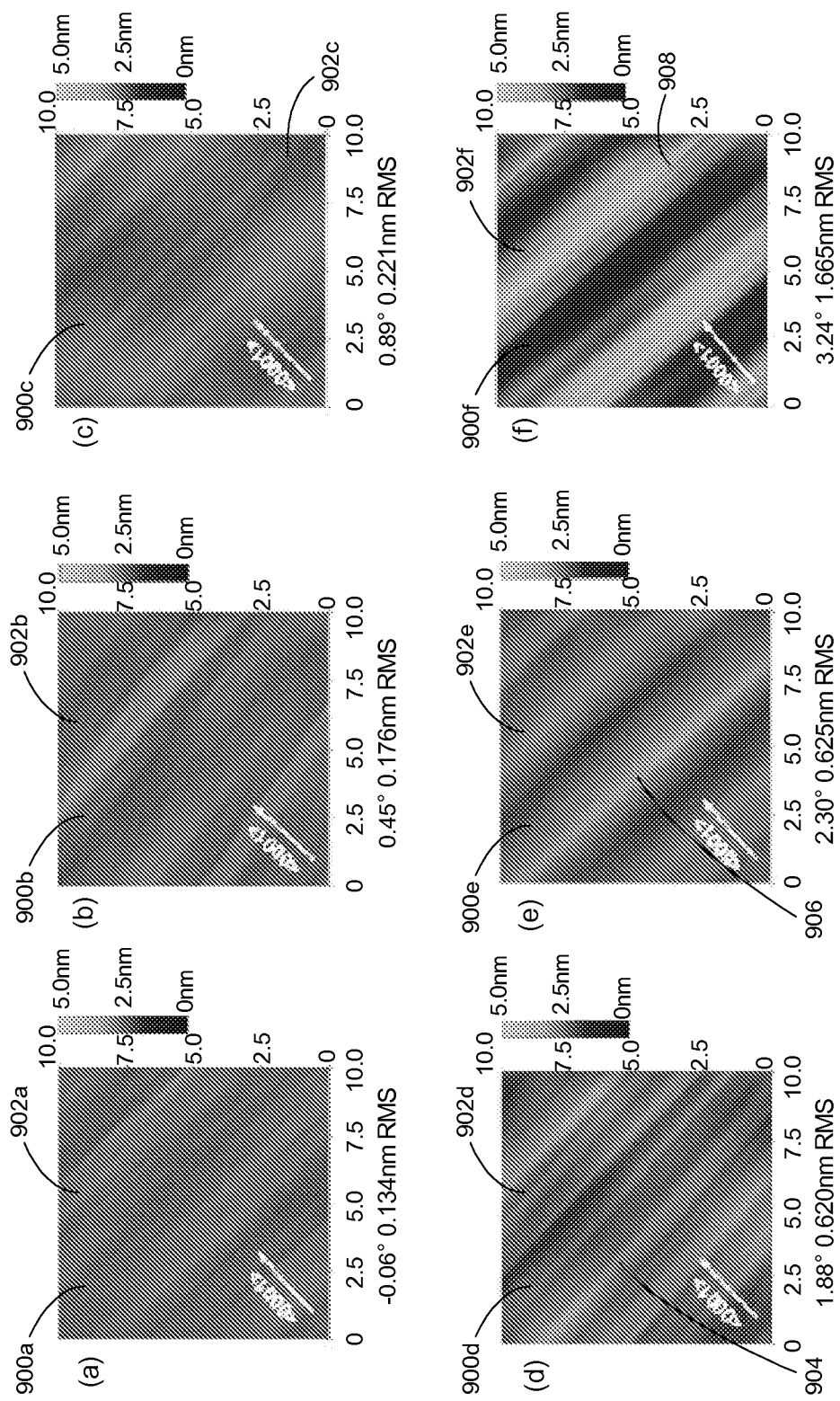
FIG. 9(a)-9(f) comprise 10 μm×10 μm atomic force microscope (AFM) scans illustrating the effect of [000-1] miscut on atomic-level surface morphology, wherein the arrows indicate the <0001> direction, miscut angles in FIGS. 9(a)-9(f) are −0.06°, 0.45°, 0.89° 1.88°, 2.30°, and 3.24° toward [000-1] respectively, and the RMS roughness in FIGS. 9(a)-9(f) are 0.134 nm, 0.176 nm, 0.221 nm, 0.620 nm, 0.625 nm and 1.665 nm, respectively.

The top surface 1138 may be smoother and more planar than a top surface shown in FIGS. 2(*a*)-2(*b*), 3(*a*)-3(*f*), 4(*a*)-4(*b*), 5, 6(*a*)-6(*b*), 7(*a*)-7(*c*), 8(*a*)-8(*c*), and/or 9(*d*)-9(*f*). For example, the top surface 1138 may have less (or a smaller density of) identifiable structures 200 with surfaces 202 inclined relative to a planar surface 204, 1138, 800*d*-800*f* (e.g. the identifiable structures may be pyramidal structures 200, hillocks, features, surface undulations, or surface striations) as compared to the surfaces shown in FIGS. 2(*a*)-2(*b*), 3(*a*)-3(*f*), 4(*a*)-4(*b*), 5, 6(*a*)-6(*b*), 7(*a*)-7(*c*), 8(*a*)-8(*c*), and/or 9(*d*)-9(*f*). The planar surface 204, 1138 is typically substantially parallel to a substrate surface 1146.

The top surface 1138 may have smaller sized surface undulations, features, or pyramidal hillocks, as compared to the surface undulations or pyramidal hillocks shown in FIGS. 2(*a*)-2(*b*), 3(*a*)-3(*f*), 4(*a*)-4(*b*), 5, 6(*a*)-6(*b*), 7(*a*)-7(*c*), 8(*a*)-8(*c*), and/or 9(*d*)-9(*f*). For example, the top surface 1138 may be smoother or have a smaller surface roughness than a top surface of a film wherein the miscut angle 1104 is away from the [000-1] direction and smaller than 0.75 or away from the [000-1] direction and greater than 1.50°.

The top surface 1138 may be smoother and more planar than a surface characterized pyramidal hillocks having a density of $8.4 \times 10^2$ cm$^{-2}$ or $1.1 \times 10^6$ cm$^{-2}$, a size of 10 micrometers and/or a slope angle of 0.1°. For example, the top surface 1138 may have a smoothness or surface roughness at least as smooth as the surface 702*d*-702*f*, 802*d*-802*f*, 900*a*-900*c* shown in FIGS. 7(*d*)-7(*f*), 8(*d*)-8(*f*), and/or 9(*a*)-9(*c*).

The film may be an m-plane GaN film and the top surface 1138 may be an m-plane of GaN. The above described surface smoothness or roughness of the top surface may be as-grown, (i.e., resulting directly from growth), although surface treatments (e.g., polishing/cleaning) may be performed subsequent to growth.

Block 1608 represents the step of depositing (e.g., growing) one or more device layers 1112, 1124, 1128, 1132 on the top surface 1138 of the film of Block 1606. The device layers 1112, 1124, 1128, 1132 may be grown with at least a portion (or 100%) of the carrier gas being comprised of H$_2$. The one or more device layers 1112, 1124, 1128, 1132 may comprise one or more p-type doped layers 1124, 1128, 1132 which may be grown with at least a portion (or 100%) of the carrier gas being comprised of H$_2$. The device layers 1112, 1124, 1128, 1132 may have a top surface 1134, 1136, 1140*c* that is at least as smooth as the top surface 1138 of the film 1108.

Block 1610 represents the end result of the preceding steps, a device (e.g., optoelectronic device) such as a nonpolar or semipolar LED, laser, or transistor, for example.

Possible Modifications

Variations in MOCVD growth conditions such as growth temperature, growth pressure, V/III ratio, precursor flows, and source materials are also possible without departing from the scope of the present invention. Control of interface quality is an important aspect of the process and is directly related to the flow switching capabilities of particular reactor designs. Continued optimization of the growth conditions can result in more accurate compositional and thickness control of the nonpolar or semipolar (Ga,Al,In,B)N thin films described above.

The surface morphology of the nonpolar GaN thin films described above was improved by growing the films in a 100% N$_2$ carrier gas. However, the scope of this invention also covers the growth of nonpolar or semipolar nitride (Ga,Al,In,B)N thin films in any carrier gas where a portion of the carrier gas is comprised of an inert gas. This inert gas may include N$_2$, He, Ne, Ar, Kr, and/or Xe. The use of such carrier gases and others not listed here are within the scope of the present invention.

The thin films described above are comprised of single homogenous and continuous layers of GaN grown directly on free-standing nonpolar GaN substrates. However, the scope of this invention also covers (Ga,Al,In,B)N thin films comprised of multiple layers having varying or graded compositions.

Additional impurities or dopants can also be incorporated into the nonpolar or semipolar (Ga,Al,In,B)N thin films described in this invention. For example, Fe, Mg, Si, and Zn are frequently added to various layers in nitride heterostructures to alter the conduction properties of those and adjacent layers. The use of such dopants and others not listed here are within the scope of the invention.

The scope of this invention also covers more than just the one nonpolar orientation (m-plane) cited in the technical description. This idea is also pertinent to all nonpolar and semipolar planes that can be used for growing nitride-based semiconductor devices. The term "nonpolar plane" includes the {11-20} planes, known collectively as a-planes, and the {10-10} planes, known collectively as m-planes. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero/Miller index.

This invention also covers the selection of particular crystal polarities. The use of curly brackets, { }, throughout this document denotes a family of symmetry-equivalent planes. Thus, the {10-12} family includes the (10-12), (-1012), (1-102), (-1102), (01-12), and (0-112) planes. All of these planes are Ga-polarity, meaning that the crystal's c-axis points away from the substrate. Likewise, the {10-1-2} family includes the (10-1-2), (-101-2), (1-10-2), (-110-2), (01-1-2), and (0-11-2) planes. All of these planes are N-polarity, meaning that the crystal's c-axis will point towards the substrate. All planes within a single crystallographic family are equivalent for the purposes of this invention, though the choice of polarity can affect the behavior of the growth process. In some applications it would be desirable to grow on N-polarity semipolar planes, while in other cases growth on Ga-polarity planes would be preferred. Both polarities are acceptable for the practice of this invention.

Moreover, substrates other than free-standing nonpolar or semipolar (Ga,Al,In,B)N substrates can be used for (Ga,Al,In,B)N thin film growth. The scope of this invention includes the growth of nonpolar or semipolar (Ga,Al,In,B)N thin films on all possible crystallographic orientations of all possible foreign substrates. These foreign substrates include, but are not limited to, silicon carbide, gallium nitride, silicon, zinc oxide, boron nitride, lithium aluminate, lithium niobate, germanium, aluminum nitride, lithium gallate, partially substituted spinels, and quaternary tetragonal oxides sharing the γ-LiAlO$_2$ structure.

Furthermore, variations in nonpolar or semipolar nitride nucleation (or buffer) layers and nucleation layer growth methods are acceptable for the practice of this invention. The growth temperature, growth pressure, orientation, and composition of the nucleation layers need not match the growth temperature, growth pressure, orientation, and composition of the subsequent nonpolar or semipolar thin films and heterostructures. The scope of this invention includes the growth of nonpolar or semipolar (Ga,Al,In,B)N thin films on all possible substrates using all possible nucleation layers and nucleation layer growth methods.

The nonpolar GaN thin films described above were grown on free-standing nonpolar GaN substrates. However, the scope of this invention also covers nonpolar or semipolar (Ga,Al,In,B)N thin films grown on epitaxial laterally overgrown (ELO) (Ga,Al,In,B)N templates. The ELO technique is a method of reducing the density of threading dislocations (TD) in subsequent epitaxial layers. Reducing the TD density can lead to improvements in device performance. For c-plane nitride LEDs and diode lasers, these improvements can include increased output power, increased internal quantum efficiencies, longer device lifetime, and reduced threshold current density [Ref. 19]. These advantages will be pertinent to all nonpolar or semipolar nitride LEDs and diode lasers grown on ELO templates.

The technical description presented above discussed the growth of nonpolar GaN thin films on free-standing nonpolar GaN substrates that were grown by HVPE in the c-direction and then sliced to expose the m-plane surface. Free-standing nonpolar or semipolar (Ga,Al,In,B)N substrates may also be created by removing a foreign substrate from a thick nonpolar or semipolar (Ga,Al,In,B)N layer, by sawing a bulk (Ga,Al,In,B)N ingot or boule into individual nonpolar or semipolar (Ga,Al,In,B)N wafers, or by any other possible crystal growth or wafer manufacturing techniques. The scope of this invention includes the growth of nonpolar or semipolar (Ga,Al,In,B)N thin films on all possible free-standing nonpolar or semipolar (Ga,Al,In,B)N wafers created by all possible crystal growth methods and wafer manufacturing techniques.

Advantages and Improvements

The existing practice is to grow nitride LEDs and diode lasers along the polar [0001] c-direction. The associated polarization-induced electric fields and inherently large effective hole mass are detrimental to the performance of state-of-the-art c-plane nitride LEDs and diode lasers. Growth of nitride LEDs and diode lasers on nonpolar or semipolar planes can significantly improve device performance by decreasing polarization effects and reducing the effective hole mass.

This invention describes a method for improving the surface morphology of (Ga,Al,In,B)N thin films on nonpolar or semipolar (Ga,Al,In,B)N substrates. These smooth (Ga,Al,In,B)N thin films can serve as a template for the growth of high performance nonpolar or semipolar nitride LEDs and diode lasers. For high-temperature growth of c-plane (Ga,Al,In,B)N on sapphire, most groups report using 100% $H_2$ as the carrier gas.

Under typical growth conditions, the use of 100% $H_2$ as the carrier gas yields c-plane (Ga,Al,In,B)N epitaxial layers with the lowest dislocation densities and smoothest epitaxial surfaces [Ref. 1]. However, when typical c-plane (Ga,Al,In,B)N growth conditions are used for the regrowth of (Ga,Al,In,B)N on nonpolar or semipolar (Ga,Al,In,B)N substrates, unusual surface morphologies can occur [Refs. 2-4]. This invention describes a method for improving the growth morphology of (Ga,Al,In,B)N thin films on nonpolar or semipolar (Ga,Al,In,B)N substrates by using an inert carrier gas such as $N_2$.

Improved surface morphology can lead to a number of advantages for nonpolar or semipolar nitride device manufacturers, including, but not limited to, better uniformity in the thickness, composition, doping, electrical properties, and luminescence characteristics of individual layers in a given device. Furthermore, smooth surfaces can be especially beneficial for nonpolar or semipolar nitride laser diodes, leading to significant reductions in optical scattering losses.

Applications of the present invention include solid-state projection displays, high resolution printers, high density optical data storage systems, next generation DVD players, high efficiency solid-state lighting, optical sensing applications, and medical applications.

REFERENCES

The following references are incorporated by reference herein.

1. Y. S. Cho, H. Hardtdegen, N. Kaluza, R. Steins, G. Heidelberger, and H. Luth, J. Cryst. Growth, 307, 6 (2007).
2. A. Hirai, Z. Jia, M. C. Schmidt, R. M. Farrell, S. P. DenBaars, S. Nakamura, J. S. Speck, K. Fujito, Appl. Phys. Lett., 91, 191906 (2007).
3. Y. Tsuda, M. Ohta, P. O. Vaccaro, S. Ito, S. Hirukawa, Y. Kawaguchi, Y. Fujishiro, Y. Takahira, Y. Ueta, T. Takakura, and T. Yuasa, Appl. Phys. Express, 1, 011104 (2008).
4. K. Okamoto, H. Ohta, D. Nakagawa, M. Sonobe, J. Ichihara, and H. Takasu, Jpn. J. Appl. Phys., 45, L1197 (2006).
5. T. Takeuchi, S. Sota, M. Katsuragawa, M. Komori, H. Takeuchi, H. Amano, and I. Akasaki, Jpn. J. Appl. Phys., 36, L382 (1997).
6. P. Lefebvre, A. Morel, M. Gallart, T. Taliercio, J. Allegre, B. Gil, H. Mathieu, B. Damilano, N. Grandjean, and J. Massies, Appl. Phys. Lett., 78, 1252 (2001).
7. N. Grandjean, B. Damilano, S. Dalmasso, M. Leroux, M. Laugt, and J. Massies, J. Appl. Phys., 86, 3714 (1999).
8. J. S. Im, H. Kollmer, J. Off, A. Sohmer, F. Scholz, and A. Hangleiter, Phys. Rev. B, 57, R9435 (1998).
9. A. Di Carlo, F. Della Sala, P. Lugli, V. Fiorentini, and F. Bernardini, Appl. Phys. Lett., 76, 3950 (2000).
10. F. Della Sala, A. Di Carlo, P. Lugli, F. Bernardini, V. Fiorentini, R. Scholz, and J. M. Jancu, Appl. Phys. Lett., 74, 2002 (1999).
11. M. Suzuki and T. Uenoyama, Jpn. J. Appl. Phys., 35, 1420 (1996).
12. E. Yablonovitch and E. O. Kane, J. Lightwave Tech., 4, 504 (1986).
13. S. H. Park, J. Appl. Phys., 91, 9904 (2002).
14. S. H. Park, Jpn. J. Appl. Phys, 42, L170 (2003).
15. S. H. Park, J. Appl. Phys., 93, 9665 (2003).
16. N. F. Gardner, J. C. Kim, J. J. Wierer, Y. C. Shen, and M. R. Krames, Appl. Phys. Lett., 86, 111101 (2005).
17. H. Masui, A. Chakraborty, B. A. Haskell, U. K. Mishra, J. S. Speck, S. Nakamura, S. P. Denbaars, Jpn. J. Appl. Phys, 44, L1329 (2005).
18. T. Koyama, T. Onuma, H. Masui, A. Chakraborty, B. A. Haskell, S. Keller, U. K. Mishra, J. S. Speck, S. Nakamura, S. P. Denbaars, T. Sota, S. F. Chichibu, Appl. Phys. Lett., 89, 091906 (2006).
19. S. Nakamura, M. Senoh, S. Nagahama, N. Iwasa, T. Yamada, T. Matsushita, H. Kiyoku, Y. Sugimoto, T. Kozaki, H. Umemoto, M. Sano, and K. Chocho, Appl. Phys. Lett., 72, 211 (1998).
20. S. Nakamura and G. Fasol, The Blue Laser Diode, (Springer, Heidelberg, 1997). This book provides an overview of c-plane (Ga,Al,In,B)N optoelectronics technology.
21. L. Coldren and S. Corzine, Diode lasers and Photonic Integrated Circuits, (Wiley Interscience, New York, 1995). Chapters 4 and Appendices 8-11 discuss the theory relevant to the design of strained quantum well lasers.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating III-nitride film, comprising:
    growing a III-nitride film having a planar top surface, wherein the planar top surface:
    is a nonpolar or semipolar plan, and
    has a root mean square surface roughness, as-grown, of less than 0.5 nanometers over an area of at least 100 micrometers squared.

2. The method of claim 1, further comprising growing the film on a III-nitride substrate or template with a miscut away from a low index crystal orientation.

3. The method of claim 2, wherein the substrate or template is an m-plane substrate or template, the miscut has a miscut angle toward a [000-1] direction between 0.75° and 1.50°, and the III-nitride film is grown on a surface of the miscut.

4. The method of claim 1, further comprising growing the film using a carrier gas, wherein at least a portion of the carrier gas is comprised of an inert gas and the inert gas is comprised of one or more of the following: $N_2$, He, Ne, Ar, Kr, or Xe.

5. The method of claim 1, wherein one or more device layers are deposited on the top surface of the film, and the device layers are grown with at least a portion of the carrier gas being comprised of $H_2$.

6. The method of claim 5, wherein the device layers include one or more p-type doped layers of the device and the p-type doped layers are grown with at least a portion of the carrier gas being comprised of $H_2$.

7. A nonpolar or semipolar III-nitride film, comprising:
a planar top surface, wherein the planar top surface:
is a nonpolar or semipolar plane, and
has a root mean square surface roughness, as-grown, of less than 0.5 nanometers over an area of at least 100 micrometers squared.

8. The film of claim 7, wherein the area has an absence of striations.

9. The film of claim 7, wherein the top surface is atomically smooth with a surface roughness on the order of a diameter of Ga,Al,In,B, and N atoms.

10. The film of claim 7, wherein the root mean square surface roughness is less than 0.25 nanometers over the area.

11. The film of claim 7, wherein the film is deposited on a surface of an m-plane substrate, and the surface of the m-plane substrate is a miscut with a miscut angle between 0.75° and 1.50° toward a [000-1] direction.

12. The film of claim 11, wherein the substrate is a Gallium Nitride substrate.

13. The film of claim 7, wherein the area of the top surface is smoother than a surface characterized pyramidal hillocks having a density of $8.4 \times 10^2$ $cm^{-2}$, a size of 10 micrometers and a slope angle of 0.1°.

14. The film of claim 7, wherein the area of the top surface is smoother than a surface characterized pyramidal hillocks having a density of $1.1 \times 10^6$ $cm^{-2}$.

15. The film of claim 7, wherein the film is an m-plane GaN film and the top surface is an m-plane of the m-plane GaN film.

16. The film of claim 7, wherein device layers grown on the film have a top surface that is at least as smooth as the top surface of the film.

17. The film of claim 7, wherein the area is optically smooth and has an absence of identifiable non-planar surface undulations or features as measured using an optical microscope and with light wavelengths between 400 nanometers and 600 nanometers, the film is a substrate for epitaxial deposition of one or more device layers that emit light having an output power of at least 2 milliwatts at 20 milliamps drive current, and the drive current is direct current.

18. The film of claim 7, wherein the plane is a nonpolar plane and the film is a nonpolar film.

19. The film of claim 7, wherein the plane is a semipolar plane and the film is a semipolar film.

20. The film of claim 7, wherein the film is Gallium Nitride.

21. The film of claim 7, wherein the film is grown on a Gallium Nitride substrate.

* * * * *